United States Patent
Duan et al.

(10) Patent No.: US 11,289,655 B2
(45) Date of Patent: Mar. 29, 2022

(54) ORGANIC ELECTROLUMINESCENT DEVICE

(71) Applicants: KUNSHAN GO-VISIONOX OPTO-ELECTRONICS CO., LTD., Kunshan (CN); TSINGHUA UNIVERSITY, Beijing (CN)

(72) Inventors: Lian Duan, Beijing (CN); Zhengyang Bin, Beijing (CN); Jingwen Tian, Kunshan (CN)

(73) Assignees: KUNSHAN GO-VISIONOX OPTO-ELECTRONICS CO., LTD., Kunshan (CN); TSINGHUA UNIVERSITY, Beijing (CN)

( * ) Notice: Subject to any disclaimer, the term of this patent is extended or adjusted under 35 U.S.C. 154(b) by 454 days.

(21) Appl. No.: 16/556,629

(22) Filed: Aug. 30, 2019

(65) Prior Publication Data
US 2019/0386224 A1 Dec. 19, 2019

Related U.S. Application Data

(63) Continuation of application No. PCT/CN2018/088882, filed on May 29, 2018.

(30) Foreign Application Priority Data

Aug. 10, 2017 (CN) .......................... 201710681005.9

(51) Int. Cl.
*H01L 51/50* (2006.01)
*H01L 51/00* (2006.01)

(52) U.S. Cl.
CPC ........ *H01L 51/0059* (2013.01); *H01L 51/005* (2013.01); *H01L 51/0061* (2013.01); *H01L 51/0072* (2013.01); *H01L 51/5004* (2013.01); *H01L 51/5088* (2013.01); *H01L 2251/552* (2013.01); *H01L 2251/558* (2013.01)

(58) Field of Classification Search
None
See application file for complete search history.

(56) References Cited

U.S. PATENT DOCUMENTS

2017/0033286 A1* 2/2017 Kugler ................ H01L 51/5004

FOREIGN PATENT DOCUMENTS

| CN | 103715361 A | 4/2014 |
|----|-------------|--------|
| CN | 105226184 A | 1/2016 |
| CN | 106409665 A | 2/2017 |
| CN | 106898699 A | 6/2017 |
| JP | 2005174675 A | 6/2005 |

(Continued)

OTHER PUBLICATIONS

International Search Report dated Sep. 4, 2018 in corresponding International application No. PCT/CN2018/088882; 4 pages.

(Continued)

*Primary Examiner* — Gregory D Clark
(74) *Attorney, Agent, or Firm* — Maier & Maier, PLLC (57) ABSTRACT

The present disclosure relates to the field of display technologies, and provides an organic electroluminescent device. The organic electroluminescent device comprises a hole injection layer. The hole injection layer includes at least one hole injection material and at least one free radical molecular material doped in the hole injection material.

9 Claims, 3 Drawing Sheets

(56) References Cited

FOREIGN PATENT DOCUMENTS

| | | |
|---|---|---|
| TW | 200940679 A | 10/2009 |
| TW | 201623574 A | 7/2016 |
| TW | 201712922 A | 4/2017 |

OTHER PUBLICATIONS

Taiwanese Office Action dated Mar. 27, 2019 in corresponding application No. 107119195; 4 pages.
Chinese Office Action dated Jul. 22, 2019 in corresponding application No. 2017106810059.9; 12 pages.
Obolda, et al., "Evolution of emission manners of organic light-emitting diodes: From emission of singlet exciton to emission of doublet exciton", Chinese Chemical Letters, 2016, p. 1345-1349, vol. 27; 5 pages.
Bodzioch, et al., "Funtional Group Transformations in Derivatives of 1,4-Dihydrobenzo[1,2,4]triazinyl Radical", The Journal of Organic Chemistry, 2014, p. 7294-7310, vol. 79; 17 pages.

\* cited by examiner

ORGANIC ELECTROLUMINESCENT DEVICE

CROSS-REFERENCE TO RELATED APPLICATION

This application is a continuation of International Application No. PCT/CN2018/088882 filed on May 29, 2018, which claims priority to Chinese patent application No. 201710681005.9 filed on Aug. 10, 2017. Both applications are incorporated herein by reference in their entireties.

TECHNICAL FIELD

The present disclosure relates to the field of display technologies.

BACKGROUND

An organic electroluminescent device (also known as an Organic Light-Emitting Diode (OLED)) is an active light-emitting device with a low power consumption, a wide color gamut, a thin thickness, and other advantages, and is expected to become the next-generation mainstream lighting and flat panel display technology.

A commonly used OLED includes a first electrode, an organic light-emitting layer, and a second electrode which are arranged on a substrate in a stacking manner. During the operation of the OLED, holes are injected into a device by means of the first electrode, and electrons are injected into the device by means of the second electrode. Carriers in the Highest Occupied Molecular Orbital (HOMO) and the Lowest Unoccupied Molecular Orbital (LUMO) of a luminescent material are combined to form excitons that release energy in the form of light.

SUMMARY

The technical problem to be solved by the present disclosure is to overcome the drawback of poor luminous efficiency of the organic electroluminescent device.

The present disclosure provides an organic electroluminescent device, comprising a hole injection layer, the hole injection layer comprising at least one hole injection material and at least one free radical molecular material, the at least one free radical molecular material being doped in the hole injection material, the SOMO level of the free radical molecular material being higher than the LUMO level of the hole injection material.

By doping at least one free radical molecular material into the hole injection layer, a single electron of the free radical molecular material is transitioned to an LUMO of a hole injection material due to the deep level property of the hole injection material and its strong electron absorption capacity, and charge transfer occurs in the hole injection layer to form free holes, so as to achieve the purpose of improving the conductivity of the hole injection layer, thereby enabling to effectively reduce the barrier of the hole injection, and increase the hole injection efficiency, and further improve the performance of the organic electroluminescent device.

In addition, the free radical molecular material is stable in the air due to its low HOMO level, allows to improve the hole injection and withstand oxygen and light for a long time at room temperature, thereby enabling to achieve the purpose of improving the performance of the organic electroluminescent device.

Optionally, the LUMO level of the hole injection material is less than or equal to −5.5 eV.

Optionally, the doping concentration of the free radical molecular material is equal to or less than 20 wt %.

Optionally, the thickness of the hole injection layer is equal to or less than 100 nm.

Optionally, the free radical molecular material is:

wherein $R_1$-$R_{22}$ are same or different substituent groups, and the substituent groups are electron-donating groups.

Since the aromatic groups of the radical molecules are not in the same plane, the molecules have large steric hindrance, leading to a small intermolecular force and a low evaporation temperature. When the free radical molecular material is doped into the hole injection layer, the purpose of doping is able to be achieved by setting a lower evaporation temperature, which is conducive to industrial production.

Moreover, $R_1$-$R_{22}$ in the foregoing radical molecule are electron-donating groups, and are connected to a conjugated chain (an aromatic group) having electron-donating properties. Therefore, there is an obvious charge transfer in the molecules to result in an increased dipole moment, thereby making the electron transition between the frontier molecular orbital energy levels easier. That is, the single electron of the free radical molecular material is more likely to transition to the LUMO of the hole injection material.

Optionally, the $R_1$-$R_{22}$ are independently selected from the group consisting of alkyl, alkenyl, aryl, heteroaryl, —OR, —SR, —N(R)$_2$, cycloalkyl, —P(R)$_2$, cyclophosphino, and halogen, wherein R is selected from the group consisting of hydrogen, alkyl, aryl, and heterocyclic-containing aryl.

Optionally, the alkyl is selected from the group consisting of methyl, ethyl, propyl, isopropyl, n-butyl, isobutyl, tert-butyl, n-pentyl, n-hexyl, n-heptyl, and n-octyl; and the cycloalkyl is selected from the group consisting of cyclopropyl, cyclobutyl, cyclopentyl, and cyclohexyl.

Optionally, the heterocyclic-containing aryl is selected from the group consisting of furyl, thienyl, pyrrolyl, imidazolyl, thiazolyl, pyridyl, pyrazinyl, pyrimidinyl, pyridazinyl, indolyl, and quinolyl.

Optionally, the free radical molecular material is selected from one of the following compounds:

(1)

(2)

(3)

(4)

(5)

(6)

(9)

(7)

(10)

(8)

(11)

-continued (12)

(13)

(14)

According to the organic electroluminescent device of the present disclosure, the purpose of improving the conductivity of the hole injection layer is able to be achieved, enabling to effectively reduce the barrier of the hole injection, and increase the efficiency of the hole injection, thereby enabling to improve the performance of the organic electroluminescent device.

DETAILED DESCRIPTION OF THE INVENTION

In the prior art, in order to improve the luminous efficiency of the organic electroluminescent device, P-type doping is generally performed on a hole transport material to increase the conductivity of the hole transport material and reduce the injection barrier of holes. For example, an organic electroluminescent device provided in the prior art includes a substrate, and a hole injection layer, a hole transport layer, and an electron blocking layer which are sequentially disposed on the substrate, wherein the material of the hole transport layer includes a P-type doped material. The LUMO level of the P-type doped material is close to the HOMO level of the hole injection material in the hole transport layer, and can improve the conductivity of the hole transport layer. Therefore, the electrons of the HOMO level of the hole injection material in the hole transport layer can be transitioned to the LUMO level of the P-type doped, thereby increasing the number of free hole carriers in the hole transport layer and improving the migration rate of the hole carriers.

However, in the foregoing technical solution, due to the internal structural disorder and the presence of impurities in an organic semiconductor material, a large number of trap levels are existed in the hole transport layer, and carriers are easily captured by the trap, so as to form a large amount of space charges in the semiconductor, thereby forming a limiting current. As the doping concentration of the P-type doped material increases, the trap level captures more holes and the limiting current is increased, thereby reducing the current density of the device and further affecting the luminous efficiency of the device.

By providing an organic electroluminescent device comprising a hole injection layer, the hole injection layer comprising at least one hole injection material and at least one free radical molecular material, the at least one free radical molecular material being doped in the hole injection material, the SOMO level of the free radical molecular material being higher than the LUMO level of the hole injection material, the present disclosure achieves the purpose of improving the performance of the organic electroluminescent device.

Several examples will be provided below, and the technical solution of the present disclosure is specifically explained with reference to the accompanying drawings. It should be noted that the following examples are only intended to facilitate the understanding of the present disclosure, and are not intended to limit the present disclosure.

The materials involved in the following examples and comparative examples are commercially available or synthesized in labs.

Example 1

This example provides an organic electroluminescent device. The organic electroluminescent device may be a white OLED device or a monochromatic OLED device, which can be used in the field of illumination or display.

Figure 1:
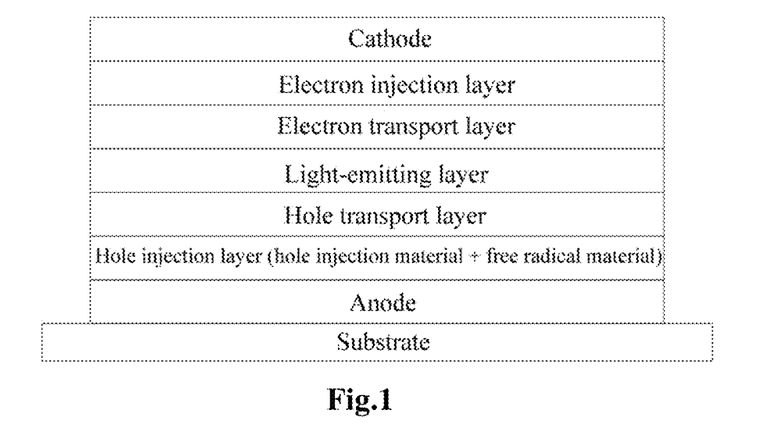
FIG. 1 is a schematic structural diagram of an organic electroluminescent device according to an example of the present disclosure.

As shown in FIG. 1, the organic electroluminescent device includes a first electrode (anode), a hole injection layer, a hole transport layer, a light-emitting layer, an electron transport layer, an electron injection layer, and a second electrode (cathode) which are arranged on a substrate in a stacking manner.

The substrate may be a flexible substrate or a rigid substrate such as glass. The flexible substrate may be made of polyester-based or polyimide-based compound material or thin metal sheet. The organic electroluminescent device may be packaged using any suitable method known to those skilled in the art. For example, Frit packaging or film packaging can be used.

The first electrode may be made of inorganic material or organic conductive polymer. The inorganic material is generally metal oxide such as Indium Tin Oxide (ITO), Zinc Oxide (ZnO), Indium Zinc Oxide (IZO), or a metal having a high work function such as gold, copper, and silver, preferably ITO. The organic conductive polymer is preferably PEDOT/PSS or polyaniline.

A luminescent dye of the light-emitting layer may be a fluorescent dye, a phosphorescent dye, or a combination thereof.

The electron injection layer is made of metal element or compound of metal and oxygen element or halogen element, or metal alloy.

The second electrode is generally made of metal material having a good conductivity such as aluminum or silver, or metal conductive oxide having a good conductivity.

The hole injection layer comprises at least one hole injection material and at least one free radical molecular material doped in the hole injection material. The free radical molecule is an open-shell molecule, with one unpaired electron and one electron vacancy site in the Singly Occupied Molecular Orbital (SOMO). In this example, the hole injection material of the organic electroluminescent device may be selected from a material of the LUMO level, and the LUMO orbital level is less than or equal to −5.5 eV. For example, the hole injection material may be HAT-CN (1,4,5,8,9,11-hexaazatriphenylenehexacarbonitrile) or $MoO_3$. The SOMO level of the free radical molecular material is higher than the LUMO level of the hole injection material, so that the electron in the free radical molecular material can be smoothly transferred to the LUMO of the hole injection material. As an alternative exemplary embodiment of this example, the free radical molecular material and the hole injection material may form a doped hole injection layer by co-evaporation.

In this example, the hole injection material is doped with a free radical molecular material. Since the free radical molecule is an open-shell molecule, the SOMO thereof has an unpaired electron and an electron vacancy site. Due to the deep level characteristics of the hole injection layer and its strong electron absorption capacity, the single electron of the free radical molecular material will be transitioned to the LUMO of the hole injection material. When the unpaired electron of the free radical is transitioned to the LUMO of the hole injection material, a free hole is left on the original HOMO of the free radical, and there is no restriction from the remaining electrons in the same orbit. In addition, the transferred free electrons can fill the trap state in the hole injection layer and promote hole transport. Therefore, the free radical molecular material undergoes charge transfer in the hole injection layer to form free holes, so as to improve the conductivity of the hole injection layer, effectively reduce the hole injection barrier, and enhance the hole injection efficiency, thereby further improving the performance of the organic electroluminescent device.

The doping concentration of the free radical molecular material is not more than 20 wt % with respect to the weight of the hole injection material, and the thickness of the hole injection layer is not more than 100 nm. The said doping concentration can improve the transfer efficiency of electrons in the free radical molecules, and achieve the purpose of greatly improving the conductivity of the hole injection layer. In addition, the hole injection layer of this thickness can improve the current efficiency of hole and electron injection, thereby improving the power efficiency of the OLED and reducing its power consumption.

In this example, the free radical molecular material is:

wherein $R_1$-$R_{22}$ are same or different substituent groups, and the substituent groups are electron-donating groups.

In this example, the $R_1$-$R_{22}$ are independently selected from the group consisting of alkyl, alkenyl, aryl, heteroaryl, —OR, —SR, —N(R)$_2$, cycloalkyl, —P(R)$_2$, cyclophosphino, and halogen, wherein R is selected from the group consisting of hydrogen, alkyl, aryl, and heterocyclic-containing aryl.

The alkyl is selected from the group consisting of methyl, ethyl, propyl, isopropyl, n-butyl, isobutyl, tert-butyl, n-pentyl, n-hexyl, n-heptyl, and n-octyl; and the cycloalkyl is selected from the group consisting of cyclopropyl, cyclobutyl, cyclopentyl, and cyclohexyl.

The heterocyclic-containing aryl is selected from the group consisting of furyl, thienyl, pyrrolyl, imidazolyl, thiazolyl, pyridyl, pyrazinyl, pyrimidinyl, pyridazinyl, indolyl, and quinolyl.

Optionally, the free radical molecular material is selected from one of the following compounds:

(1)

(2)

-continued (3)

(4)

(5)

(6)

(7)

(8)

(9)

(10)

(11)

-continued

As an optional exemplary embodiment of this example, the free radical molecular material is formula (1), the doping concentration of the free radical molecular material is 10 wt %, and the thickness of the hole injection layer is 10 nm.

As an example of the present disclosure, the structure of the device in this example is: ITO (5 nm)/formula (1):HAT-CN (10%, 10 nm)/NPB (20 nm)/Ir(ppy)$_3$:DIC-TRZ (10%, 30 nm)/Bphen (40 nm)/o-MeO-DMBI (4.5 nm)/Al (150 nm).

ITO is a material of the first electrode, indium tin oxide, and has the thickness of 5 nm.

HAT-CN is a material (i.e., the hole injection material) of the hole injection layer, dipyrazino[2,3f;2',3'-H]quinoxaline 2,3,6,7,10,11-hexaonitrile. The free radical molecular material is formula (1), the doping concentration is 10 wt %, and the thickness of the hole injection layer is 10 nm.

NPB is a material of the hole transport layer, N,N'-diphenyl-N,N'-(1-naphthyl)-(1,1'-biphenyl)-4,4'-diamine. The thickness of the hole transport layer is 20 nm.

Ir(ppy)$_3$ is a green dye doped in the light-emitting layer, tris(2-phenylpyridine)ruthenium, and the doping concentration is 10 wt %.

DIC-TRZ is a host material of the light-emitting layer, 2,4-diphenyl-6-bis(12-phenylindolo[2,3-a]carbazol-11-yl)-1,3,5-triazine. The thickness of the light-emitting layer is 30 nm.

Bphen is a material of the electron transport layer, 4,7-diphenyl-1,10-phenanthroline. The thickness of the electron transport layer is 40 nm.

o-MeO-DMBI is a material of the electron injection layer, 3-dihydro-1H-benzimidazole. The thickness of the electron injection layer is 4.5 nm.

Al is a material of the second electrode layer. The thickness of the second electrode layer is 150 nm.

Example 2

This example provides an organic electroluminescent device, and the specific structure thereof is substantially same as that of Example 1, except that the free radical molecular material is formula (2), the doping concentration is 20 wt %, and the thickness of the hole injection layer is 20 nm.

Example 3

This example provides an organic electroluminescent device, and the specific structure thereof is substantially same as that of Example 1, except that the free radical molecular material is formula (3), the doping concentration is 15 wt %, and the thickness of the hole injection layer is 50 nm.

Example 4

This example provides an organic electroluminescent device, and the specific structure thereof is substantially same as that of Example 1, except that the free radical molecular material is formula (4), the doping concentration is 12 wt %, and the thickness of the hole injection layer is 70 nm.

Example 5

This example provides an organic electroluminescent device, and the specific structure thereof is substantially same as that of Example 1, except that the free radical molecular material is formula (5), the doping concentration is 10 wt %, and the thickness of the hole injection layer is 90 nm.

Example 6

This example provides an organic electroluminescent device, and the specific structure thereof is substantially same as that of Example 1, except that the free radical molecular material is formula (6), the doping concentration is 8 wt %, and the thickness of the hole injection layer is 10 nm.

Example 7

This example provides an organic electroluminescent device, and the specific structure thereof is substantially same as that of Example 1, except that the free radical molecular material is formula (7), the doping concentration is 15 wt %, and the thickness of the hole injection layer is 100 nm.

Example 8

This example provides an organic electroluminescent device, and the specific structure thereof is substantially same as that of Example 1, except that the free radical molecular material is formula (8), the doping concentration is 15 wt %, and the thickness of the hole injection layer is 25 nm.

Example 9

This example provides an organic electroluminescent device, and the specific structure thereof is substantially same as that of Example 1, except that the free radical molecular material is formula (9), the doping concentration is 5 wt %, and the thickness of the hole injection layer is 50 nm.

Example 10

This example provides an organic electroluminescent device, and the specific structure thereof is substantially same as that of Example 1, except that the free radical molecular material is formula (10), the doping concentration is 5 wt %, and the thickness of the hole injection layer is 10 nm.

Example 11

This example provides an organic electroluminescent device, and the specific structure thereof is substantially same as that of Example 1, except that the free radical molecular material is formula (11), the doping concentration is 10 wt %, and the thickness of the hole injection layer is 10 nm. The SOMO orbital level of the free radical molecular material of formula (11) is −5.47 eV.

The unpaired electron in the free radical molecule of formula (11) is transitioned from the SOMO level to the LUMO of the HAT-CN when the free radical molecular material of formula (11) is doped into the hole injection material HAT-CN. In the hole injection layer doped with the free radical molecules of formula (11), a large amount of moving holes are existed in the LUMO of the organic group, and the limitation of electrons can be ignored, so that the hole conductivity of the hole injection layer is greatly improved.

In addition, the transferred electrons in the hole injection material can fill the trap state in the hole injection layer, which is also conducive to hole transport. Therefore, a hole injection material HAT-CN film doped with the free radical molecules of formula (11) is used as a novel hole injection layer, which can improve hole conductivity and enhance hole injection.

Figure 2A:
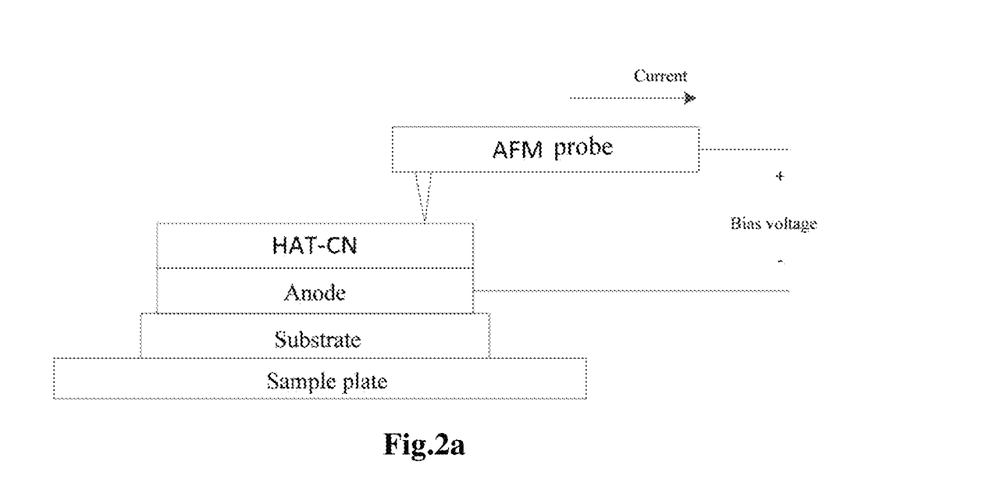
FIG. 2a is a measurement principle diagram of a conducting Atomic Force Microscopy (AFM) according to an example of the present disclosure.
Figure 2B:
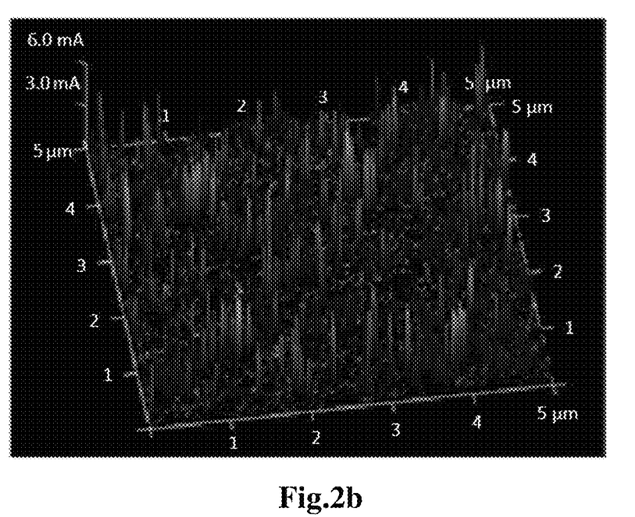
FIG. 2b is a current density diagram of an undoped hole injection layer (HAT-CN) film according to Example 11 of the present disclosure.
Figure 2C:
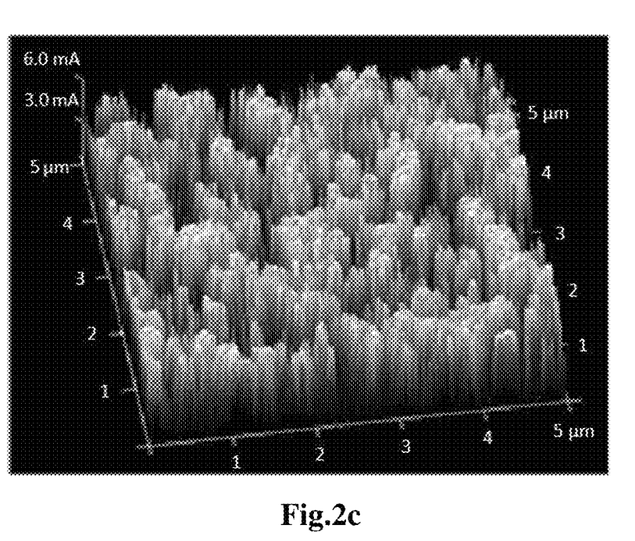
FIG. 2c is a current density diagram of a hole injection layer film doped with a free radical molecule of formula (11) according to Example 11 of the present disclosure.
Figure 2D:
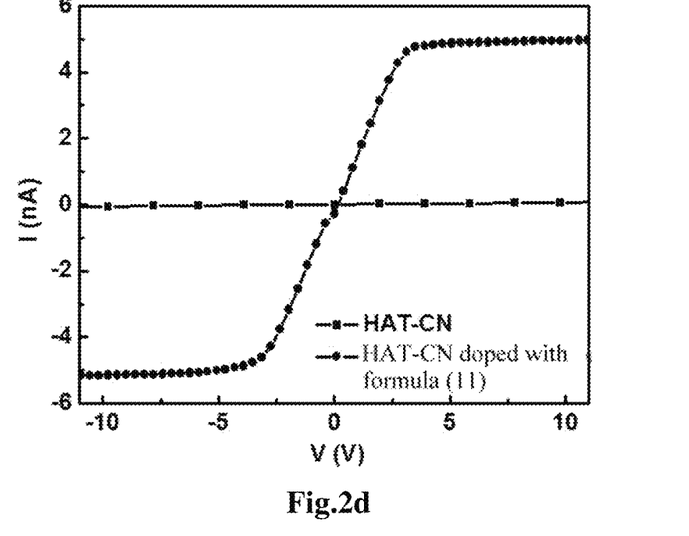
FIG. 2d is a graph showing current-voltage characteristics of different hole injection layer films according to Example 11 and Comparative Example 2 of the present disclosure.

The influence of the doped free radical molecular material of formula (11) on the conductivity of HAT-CN is measured by a conducting AFM. The test principle is shown in FIG. 2a. It can be seen from FIGS. 2b and 2c that the conductivity of the HAT-CN film doped with the free radical molecular material of formula (11) is significantly improved, which indicates that the free radical molecular material of formula (11) and the HAT-CN can form an excellent charge transfer, thereby increasing the free carrier concentration. FIG. 2d is a comparison chart of current-voltage characteristics of the hole injection layer of this example and the undoped hole injection layer. It can be seen from the chart that, after a forward voltage is applied to the hole injection layer of this example, the current density of the film layer is significantly higher than that of the undoped HAT-CN film layer.

Example 12

This example provides an organic electroluminescent device, and the specific structure thereof is substantially same as that of Example 1, except that the free radical molecular material is formula (12), the doping concentration is 10 wt %, and the thickness of the hole injection layer is 15 nm.

Example 13

This example provides an organic electroluminescent device, and the specific structure thereof is substantially same as that of Example 1, except that the free radical molecular material is formula (13), the doping concentration is 15 wt %, and the thickness of the hole injection layer is 20 nm.

Example 14

This example provides an organic electroluminescent device, and the specific structure thereof is substantially same as that of Example 1, except that the free radical molecular material is formula (14), the doping concentration is 20 wt %, and the thickness of the hole injection layer is 25 nm.

Comparative Example 1

This comparative example provides an organic electroluminescent device, including a first electrode, a hole transport layer, a light-emitting layer, an electron transport layer, an electron injection layer, and a second electrode which are arranged on a substrate in a stacking manner. The specific device structure is substantially same as that of Example 11, except that the hole injection layer is not provided in the organic electroluminescent device.

Comparative Example 2

This comparative example provides an organic electroluminescent device, including a first electrode, a hole injection layer, a hole transport layer, a light-emitting layer, an electron transport layer, an electron injection layer, and a second electrode which are arranged on a substrate in a stacking manner. The specific device structure is substantially same as that of Example 11, except that the hole injection layer does not contain a free radical molecular material.

Comparative Example 3

This comparative example provides an organic electroluminescent device, including a first electrode, a hole injection layer, a hole transport layer, a light-emitting layer, an electron transport layer, an electron injection layer, and a second electrode which are arranged on a substrate in a stacking manner. The specific device structure is substantially same as that of Example 11, except that the free radical molecular material is represented by the following formula, and the SOMO level is −5.75 eV, which is lower than the LUMO level of the hole injection material.

(12)

Figure 3:
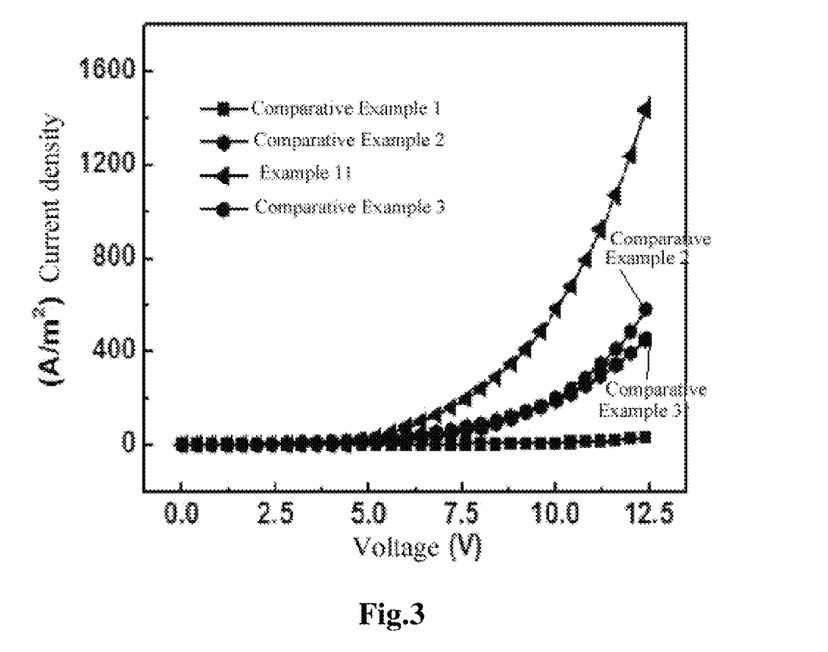
FIG. 3 is a graph showing current density-voltage characteristics of organic electroluminescent devices according to Example 11 and Comparative Examples 1-3 of the present disclosure.

Example 11 and Comparative Examples 1-3 are compared and analyzed through experiments, and the experimental results are shown in FIG. 3 showing a trend chart of current density as a function of voltage. The organic electroluminescent device of Comparative Example 1 is not provided with a hole injection layer, and holes are hardly injected from the first electrode into the hole transport material. The current density does not change significantly as the driving voltage increases, and the overall value is relatively low. The organic electroluminescent device of Comparative Example 2 has a hole injection layer, but is not doped with a level-adaptive free radical molecular material. The current density is increased to a certain extent as the driving voltage increases, but the amount of increase is low. The current density is only 600 A/m$^2$ when the driving voltage is 12.5 eV. The organic electroluminescent device of Comparative Example 3 has a hole injection layer and is doped with the free radical molecular material. However, the SOMO level of the free radical molecular material is lower than the LUMO level of the hole injection material. The current density is increased to a certain extent as the driving voltage increases, but the amount of increase is slightly lower than that of the undoped device. However, in the organic electroluminescent device of Example 11, the free radical molecular material shown in formula (11) has a higher SOMO level, and can form a better charge transfer with the hole injection material, thereby increasing the hole concentration and enhancing the hole injection. The current density can be rapidly and greatly increased as the driving voltage increases. The current density is about 3 times that of Comparative Example 2 when the driving voltage is 12.5 eV.

Comparative Example 4

This comparative example provides an organic electroluminescent device, including a first electrode, a hole injection layer, a hole transport layer, a light-emitting layer, an electron transport layer, an electron injection layer, and a second electrode which are arranged on a substrate in a stacking manner. The specific structure is substantially same as that of Example 11, except that the free radical molecular material of formula (11) is doped in the light-emitting layer.

Comparative Example 5

This comparative example provides an organic electroluminescent device, including a first electrode, a hole injection layer, a hole transport layer, a light-emitting layer, an electron transport layer, an electron injection layer, and a second electrode which are arranged on a substrate in a stacking manner, wherein the side of the hole injection layer away from the hole transport layer is provided with a free radical molecular material layer.

The structure of the device of this comparative example is: ITO/formula (11) (5 nm)/HAT-CN (5 nm)/NPB (20 nm)/Ir(ppy)$_3$:DIC-TRZ (10%, 30 nm)/Bphen (40 nm)/o-MeO-DMBI (4.5 nm)/Al (150 nm).

Comparative Example 6

This comparative example provides an organic electroluminescent device, including a first electrode, a hole injection layer, a hole transport layer, a light-emitting layer, an electron transport layer, an electron injection layer, and a second electrode which are arranged on a substrate in a stacking manner, wherein the free radical molecular material layers are arranged on both sides of the hole injection layer in a stacking manner.

The structure of the device of this comparative example is: ITO/formula (11) (5 nm)/HAT-CN (5 nm)/formula (11) (5 nm)/NPB (20 nm)/Ir(ppy)$_3$:DIC-TRZ (10%, 30 nm)/Bphen (40 nm)/o-MeO-DMBI (4.5 nm)/Al (150 nm).

TABLE 1

Parameter tests of organic electroluminescent devices corresponding to examples and comparative examples

| | Conductivity of hole injection layer (S/m) | Device efficiency (cd/A) | Driving voltage (V) |
|---|---|---|---|
| Example 1 | 2.1 * 10$^{-5}$ | 30 | 3.0 |
| Example 2 | 2.5 * 10$^{-5}$ | 30 | 2.8 |
| Example 3 | 3.0 * 10$^{-5}$ | 29 | 2.7 |
| Example 4 | 3.2 * 10$^{-5}$ | 31 | 2.7 |
| Example 5 | 3.8 * 10$^{-5}$ | 30 | 2.7 |
| Example 6 | 3.5 * 10$^{-5}$ | 32 | 2.7 |
| Example 7 | 5 * 10$^{-5}$ | 33 | 2.6 |
| Example 8 | 7 * 10$^{-5}$ | 33 | 2.4 |
| Example 9 | 1 * 10$^{-5}$ | 31 | 2.9 |
| Example 10 | 8 * 10$^{-5}$ | 32 | 2.6 |
| Example 11 | 5 * 10$^{-5}$ | 30 | 2.7 |
| Example 12 | 4.7 * 10$^{-5}$ | 31 | 2.5 |
| Example 13 | 5.2 * 10$^{-5}$ | 32 | 2.7 |
| Example 14 | 6.8 * 10$^{-5}$ | 33 | 2.6 |
| Comparative Example 1 | | 19 | 3.5 |
| Comparative Example 2 | 2 * 10$^{-8}$ | 25 | 3.3 |
| Comparative Example 3 | 3 * 10$^{-8}$ | 24 | 3.4 |
| Comparative Example 4 | 2.4 * 10$^{-5}$ | 20 | 3.5 |
| Comparative Example 5 | 4.3 * 10$^{-5}$ | 30 | 2.8 |
| Comparative Example 6 | 2.3 * 10$^{-6}$ | 28 | 2.7 |

It can be seen from data in Table 1 that, the hole injection layer provided by the examples of the present disclosure has a high conductivity, enables to effectively reduce the driving voltage of the organic electroluminescent device to which the hole injection layer is applied, and improve the luminous efficiency of the device. Specifically, when the unpaired electron of the free radical in the free radical molecular material is transitioned to the LUMO of the hole injection material, a free hole is left on the original HOMO of the free radical, and there is no restriction from the remaining electrons in the same orbit. In addition, the transferred free electrons can fill the trap state in the hole injection layer and promote hole transport. Therefore, the free radical molecular material undergoes charge transfer in the hole injection layer to form free holes, so as to improve the conductivity of the hole injection layer, effectively reduce the hole injection barrier, and enhance the hole injection efficiency, thereby further improving the performance of the organic electroluminescent device. Therefore, as shown in Comparative Examples 4, 5, and 6, the object of the present disclosure cannot be achieved regardless of the free radical molecular material is doped in other functional layers such as the light-emitting layer or separately provided as a film in a device.

What is claimed is:

1. An organic electroluminescent device, comprising a hole injection layer, the hole injection layer comprising at least one hole injection material and at least one free radical molecular material, the at least one free radical molecular material being doped in the hole injection material, a SOMO level of the free radical molecular material being higher than a LUMO level of the hole injection material.

2. The organic electroluminescent device according to claim 1, wherein the LUMO level of the hole injection material is less than or equal to −5.5 eV.

3. The organic electroluminescent device according to claim 1, wherein a doping concentration of the free radical molecular material is equal to or less than 20 wt %.

4. The organic electroluminescent device according to claim 1, wherein a thickness of the hole injection layer is equal to or less than 100 nm.

5. The organic electroluminescent device according to claim 1, wherein the free radical molecular material is:

wherein $R_1$-$R_{22}$ are same or different substituent groups, and the substituent groups are electron-donating groups.

6. The organic electroluminescent device of claim 5, wherein the $R_1$-$R_{22}$ are independently selected from a group consisting of alkyl, alkenyl, aryl, heteroaryl, —OR, —SR, —N(R)$_2$, cycloalkyl, —P(R)$_2$, cyclophosphino, and halogen, wherein R is selected from a group consisting of hydrogen, alkyl, aryl, and heterocyclic-containing aryl.

7. The organic electroluminescent device according to claim 6, wherein the alkyl is selected from a group consisting of methyl, ethyl, propyl, isopropyl, n-butyl, isobutyl, tert-butyl, n-pentyl, n-hexyl, n-heptyl, and n-octyl; and the cycloalkyl is selected from a group consisting of cyclopropyl, cyclobutyl, cyclopentyl, and cyclohexyl.

8. The organic electroluminescent device according to claim 6, wherein the heterocyclic-containing aryl is selected from a group consisting of furyl, thienyl, pyrrolyl, imidazolyl, thiazolyl, pyridyl, pyrazinyl, pyrimidinyl, pyridazinyl, indolyl, and quinolyl.

9. The organic electroluminescent device according to claim 1, wherein the free radical molecular material is selected from one of the following compounds:

(3)

(4)

(5)

(6)

(7)

(8)

(9)

(10)

(11)

(12)

(13)

(14)

* * * * *